US008093618B2

United States Patent
Lee et al.

(10) Patent No.: US 8,093,618 B2
(45) Date of Patent: Jan. 10, 2012

(54) MULTI-LAYER OHMIC ELECTRODE, SEMICONDUCTOR LIGHT EMITTING ELEMENT HAVING MULTI-LAYER OHMIC ELECTRODE, AND METHOD OF FORMING SAME

(75) Inventors: Jong Lam Lee, Seoul (KR); Sang Han Lee, Daejeon (KR)

(73) Assignees: Seoul Opto Device Co., Ltd., Ansan-si (KR); Postech Academy-Industry Foundation, Pohang (KR)

( * ) Notice: Subject to any disclaimer, the term of this patent is extended or adjusted under 35 U.S.C. 154(b) by 235 days.

(21) Appl. No.: 12/517,321

(22) PCT Filed: Oct. 11, 2007

(86) PCT No.: PCT/KR2007/004980
§ 371 (c)(1),
(2), (4) Date: Jun. 2, 2009

(87) PCT Pub. No.: WO2008/069429
PCT Pub. Date: Jun. 12, 2008

(65) Prior Publication Data
US 2010/0084682 A1    Apr. 8, 2010

(30) Foreign Application Priority Data
Dec. 4, 2006   (KR) ................ 10-2006-0121597

(51) Int. Cl.
*H01L 33/00* (2010.01)
*H01L 23/48* (2006.01)
*H01L 23/52* (2006.01)
*H01L 23/40* (2006.01)
*H01L 21/44* (2006.01)
*H01L 21/28* (2006.01)
*H01L 21/3205* (2006.01)

(52) U.S. Cl. ... 257/99; 257/744; 257/745; 257/E29.143; 438/597; 438/602; 438/603; 438/604; 438/605

(58) Field of Classification Search .................... None
See application file for complete search history.

(56) References Cited

U.S. PATENT DOCUMENTS 3,987,480 A * 10/1976 Diguet et al. ............ 257/771
2004/0222524 A1 * 11/2004 Song et al. ............... 257/744
(Continued)

FOREIGN PATENT DOCUMENTS

| JP | 2005-268275 | 9/2005 |
| JP | 2006-059933 | 3/2006 |
| KR | 10-2006-0080337 | 7/2006 |

OTHER PUBLICATIONS

Machine translation of Examined Publication of Korean Patent Application No. 10-2006-0035088 to Lee et al. Publication date of Jun. 8, 2007.*
Wipo publication No. WO 2006/011672 A1 to Miki. Publication date of Feb. 2, 2006.*

*Primary Examiner* — Fernando L Toledo
*Assistant Examiner* — Michael Jung
(74) *Attorney, Agent, or Firm* — H.C. Park & Associates, PLC (57) ABSTRACT

There are provided an ohmic electrode, which includes a contact layer made of an Al alloy and formed on a nitride-based semiconductor layer functioning as a light emitting layer, a reflective layer made of Ag metal, formed on the contact layer and having some particles in-diffused to the semiconductor layer, and a protective layer formed on the reflective layer to restrain out-diffusion of the reflective layer; a method of forming the ohmic electrode; and a semiconductor light emitting element having the ohmic electrode. The present invention has strong adhesive strength and low contact resistance since the reflective layer and the light emitting layer directly form an ohmic contact due to the interface reaction during heat treatment, and the present invention has high light reflectance and excellent thermal stability since the contact layer and the protective layer restrain out-diffusion of the reflective layer during heat treatment.

13 Claims, 4 Drawing Sheets

U.S. PATENT DOCUMENTS

| | | | |
|---|---|---|---|
| 2005/0145876 A1* | 7/2005 | Kwak et al. | 257/103 |
| 2005/0184300 A1* | 8/2005 | Tazima et al. | 257/94 |
| 2006/0081834 A1* | 4/2006 | Tada et al. | 257/14 |
| 2006/0125376 A1* | 6/2006 | Ghosh et al. | 313/503 |

* cited by examiner

MULTI-LAYER OHMIC ELECTRODE, SEMICONDUCTOR LIGHT EMITTING ELEMENT HAVING MULTI-LAYER OHMIC ELECTRODE, AND METHOD OF FORMING SAME

TECHNICAL FIELD

The present invention relates to an ohmic electrode, a method of forming the same and a semiconductor light emitting element having the same, and more particularly, to an ohmic electrode formed in contact with a region of a light emitting layer such that external operation power can be provided to the light emitting layer for emitting light, a method of forming the ohmic electrode, and a semiconductor light emitting element having the ohmic electrode.

BACKGROUND ART

A semiconductor light emitting elements has small size, lightweight, low power consumption and long life span, and does not require preheating time and driving circuits. Further, since the semiconductor light emitting element is resistant to impact and vibration and can be packaged into various shapes, the semiconductor light emitting element is expected to substitute for a backlight of a large-sized liquid crystal display, a general illuminator and a light source for a vehicle headlight within next few years.

In particular, a nitride-based semiconductor light emitting element has excellent characteristics of electron affinity, electron mobility, electron saturation velocity and electric field breakdown voltage, so that high efficiency and high power can be implemented. Since the nitride-based semiconductor light emitting element does not contain harmful substance such as As or Hg, it has been noticed as an environment-friendly element.

However, nitride semiconductor light emitting elements that have been developed up to now are still unsatisfactory in view of high power, light emitting efficiency and price, and their performance should be more improved. Particularly, in order for the light emitting elements to substitute for conventional mercury lamps and fluorescent lamps, a problem of high power and thermal stability in accordance therewith should be solved.

In general, a nitride semiconductor light emitting element is fabricated by sequentially laminating a nitride n-type layer, a nitride active layer and a nitride p-type layer, and then disposing two electrodes horizontally so as to apply power to the n-type and p-type layers.

Although fabrication process of such a light emitting element with a horizontal structure is relatively simple and thus cost effective, but it is difficult to implement high power. That is, since light emitted from the active layer is absorbed in the two electrodes and thus is not emitted to the outside, the high power cannot be implemented. In addition, a sapphire substrate has a low thermal conductivity and thus heat generated during the operation can not be effectively emitted, which lowers the thermal stability.

In order to solve such problems, a light emitting element with vertical structures and flip-chip type light emitting elements have been suggested. In this case, a reflective layer is formed on any one electrode to allow light generated from an active layer to be easily emitted to the outside, whereby utilization efficiency of the light can be enhanced. Further, a metal substrate with excellent thermal conductivity is used in place of a sapphire substrate, so that the thermal stability can be enhanced.

Thus, in order to achieve higher power, the development of an electrode having high light reflectivity should be preceded. Since Al or Ag metal is excellent in a visible ray region in view of light reflectivity, an excellent characteristic of light output can be achieved by using such a metal as an electrode. However, since Al has large contact resistance with a nitride-based semiconductor layer, it is difficult to supply large current. On the contrary, although Ag has lower contact resistance, it has poor interlayer adhesive strength and low thermal stability. Therefore, agglomeration, interface voids and the like are formed during high temperature heat treatment.

Due to such problems, Ni/Au based electrodes used for light emitting elements having a horizontal structure is still used. Therefore, it is limited to ensure light output to the extent where the light emitting elements can substitute for conventional white light sources.

DISCLOSURE OF INVENTION

Technical Problem

The present invention is provided to solve the aforementioned problems. The present invention provides an ohmic electrode, a method of forming the ohmic electrode and a semiconductor light emitting element having the ohmic electrode, wherein a contact layer formed of an Al alloy, a reflective layer formed of Ag metal and a protective layer for restraining out-diffusion of the Ag reflective layer are sequentially laminated on a light emitting layer for emitting light; heat treatment is then performed to form an ohmic contact while some particles in the reflective layer are diffused towards the light emitting layer and the contact layer and protective layer restrain excessive diffusion of the reflective layer; and the ohmic electrode thereby has low contact resistance together with strong adhesive strength, and excellent thermal stability together with high light reflectance.

Technical Solution

According to the present invention for achieving the objects, there is provided an ohmic electrode, comprising: a contact layer made of an Al alloy and formed on a nitride-based semiconductor layer functioning as a light emitting layer; a reflective layer made of Ag metal, formed on the contact layer and having some particles in-diffused to the semiconductor layer; and a protective layer formed on the reflective layer to restrain out-diffusion of the reflective layer.

The contact layer may be 2 to 5 nm in thickness, the reflective layer may be 150 to 5000 nm in thickness, and the protective layer may be 40 to 100 nm in thickness.

The contact layer may be formed of an alloy containing Al metal and any one metal selected from Mg, Cu, In and Sn, and the protective layer may be formed of any one metal selected from Ru, Ir, Rh, Pt, W, Ta, Ti and Co.

According to the present invention for achieving the objects, there is provided a method of forming an ohmic electrode comprising: sequentially laminating a contact layer formed of an Al alloy, a reflective layer formed of Ag metal and a protective layer for restraining out-diffusion of the reflective layer on a predetermined semiconductor layer functioning as a light emitting layer; and performing a heat treatment process of the structure having the contact layer, the reflective layer and the protective layer so that an ohmic contact is formed on an interface between the ohmic electrode and the semiconductor layer due to some particles in-diffused from the reflective layer.

The heat treatment process may be performed at a temperature of 200 to 600° C., and the heat treatment process may be performed in an atmosphere containing oxygen. That is, the heat treatment process may be performed under any one of an oxygen atmosphere, an air atmosphere, an oxygen-nitrogen mixture atmosphere, and an oxygen-argon mixture atmosphere.

According to the present invention for achieving the objects, there is provided a semiconductor light emitting element, comprising: a nitride-based semiconductor layer functioning as a light emitting layer; and an ohmic electrode formed on the semi-conductor layer, wherein the ohmic electrode comprises a contact layer made of an Al alloy and formed on the nitride-based semiconductor layer functioning as the light emitting layer; a reflective layer made of Ag metal, formed on the contact layer and having some particles in-diffused to the semiconductor layer; and a protective layer formed on the reflective layer to restrain out-diffusion of the reflective layer.

Advantageous Effects

As described above, an ohmic electrode according to the present invention includes a contact layer formed of an Al alloy, a reflective layer formed of Ag metal and a protective layer for restraining out-diffusion of the Ag reflective layer. Thus, a metallization reaction is progressed in the entire interface between the contact layer and a light emitting layer due to Ag particles in-diffused from the reflective layer during heat treatment, and out-diffusion of the Ag particles are restrained by the contact layer and the protective layer. Therefore, advantageous effects can be expected as follows:

First, since the reflective layer and the light emitting layer directly form an ohmic contact due to the interface reaction during heat treatment, the present invention has strong adhesive strength and low contact resistance.

Further, since the contact layer and the protective layer restrain out-diffusion of the reflective layer during heat treatment, the present invention has high light reflectance and excellent thermal stability.

Furthermore, since high-priced metal such as Au or Pt is not used in the present invention, manufacturing costs can be reduced.

In addition, since the contact layer and the reflective layer are formed of Al and Ag having an excellent light reflectance characteristic, the present invention has high light reflectance.

BEST MODE FOR CARRYING OUT THE INVENTION

Hereinafter, exemplary embodiments of the present invention will be described in detail with reference to the accompanying drawings.

However, the present invention is not limited to the embodiments disclosed below but may be implemented into different forms. These embodiments are provided only for illustrative purposes and for full understanding of the scope of the present invention by those skilled in the art. Throughout the drawings, like reference numerals are used to designate like elements.

Figure 1:
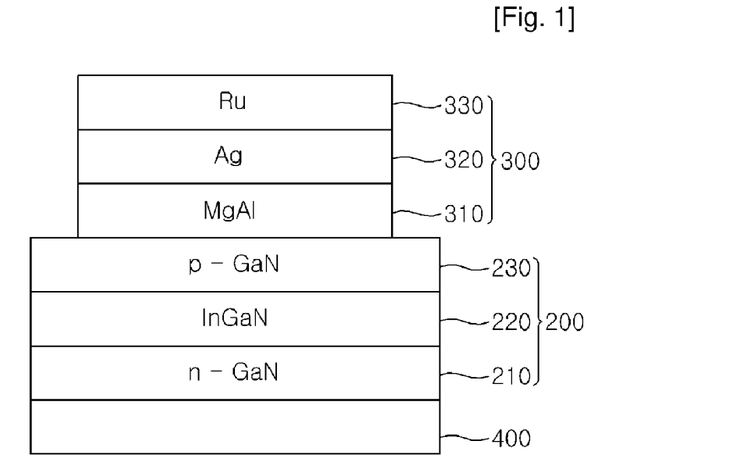
FIG. 1 is a sectional view showing a semiconductor light emitting element according to a first embodiment of the present invention.

FIG. 1 is a sectional view showing a semiconductor light emitting element according to a first embodiment of the present invention.

Referring to FIG. 1, the semiconductor light emitting element includes a light emitting layer 200, an n-type electrode 400 formed on one side of the light emitting layer 200, and a p-type electrode 300 formed on the other side of the light emitting layer 200. The p-type electrode 300 is formed to have a multi-layered structure including a contact layer 310, a reflective layer 320 and a protective layer 330.

The light emitting layer 200 includes an n-type layer 210, an active layer 220 and a p-type layer 230, which are formed of one of a Si film, a GaN film, an AlN film, an InGaN film, an AlGaN film, an AlInGaN film, a semiconductor thin film including them and combinations thereof. For example, in this embodiment, the n-type and p-type layers 210 and 230 are formed of a GaN film, and the active layer 220 is formed of an InGaN film.

The n-type layer 210, which is a layer for providing electrons, may include an n-type semiconductor layer and an n-type clad layer. The n-type semiconductor layer and n-type clad layer may be formed by implanting n-type impurities, e.g., Si, Ge, Se, Te, C or the like, into the aforementioned semiconductor thin film.

The p-type layer 230, which is a layer for providing holes, may include a p-type semiconductor layer and a p-type clad layer. The p-type semiconductor layer and p-type clad layer may be formed by implanting p-type impurities, e.g., Mg, Zn, Be, Ca, Sr, Ba or the like, into the aforementioned semiconductor thin film.

The active layer 220 is a layer for emitting light having a predetermined wavelength through recombination of electrons provided from the n-type layer 210 and holes provided from the p-type layer 230. The active layer 220 may be formed of multi-layered semiconductor thin films having a multiple quantum well structure, which is formed by alternately laminating well layers and barrier layers, or a bulk structure. Since the wavelength of the output light is changed depending on a semiconductor material of the active layer 220, a semiconductor material may be appropriately selected depending on a target wavelength.

In this embodiment, the n-type layer 210 is formed by depositing a GaN thin film and thereafter implanting n-type impurities, the active layer 220 having a multiple quantum well structure is formed on the n-type layer 210 by alternately depositing GaN thin film which is a barrier layer and InGaN thin film which is a well layer, and then p-type layer 130 is formed by depositing a GaN thin film on the active layer 220 and then implanting p-type impurities to form the light emitting layer 200 described above.

The n-type electrode 400 may include one of Pb, Sn, Au, Ge, Cu, Bi, Cd, Zn, Ag, Ni, Ti, an alloy of them and combinations thereof. It will be apparent that a metal film having a multi-layered structure may be used as the n-type electrode 400.

An ohmic electrode of a multi-layered structure including the contact layer 310, the reflective layer 320 and the protective layer 330 may be used as the p-type electrode 300. The contact layer 310 may be formed of an alloy layer including Al and any one selected from Mg, Cu, In and Sn. The reflective layer 320 may be formed of a metal layer including Ag, and the protective layer 330 may be formed of a metal layer including any one selected from Ru, Ir, Rh, Pt, W, Ta, Ti and Co. For example, in this embodiment, the contact layer 310 is formed of MgAl alloy, the reflective layer 320 is formed of Al metal, and the protective layer 330 is formed of Ru metal.

Hereinafter, a process of manufacturing the semiconductor light emitting element having such a configuration according to the first embodiment of the present invention will be briefly described.

FIGS. 2 to 5 are sectional views showing a process of manufacturing the semiconductor light emitting element according to the first embodiment of the present invention.

Referring to FIGS. 2 to 5, a light emitting layer 200 with a multi-layered structure is formed by sequentially laminating an n-type layer 210, an active layer 220 and a p-type layer 230 on a substrate 100, and individual cells are formed by performing a patterning process using a predetermined mask.

Figure 2:
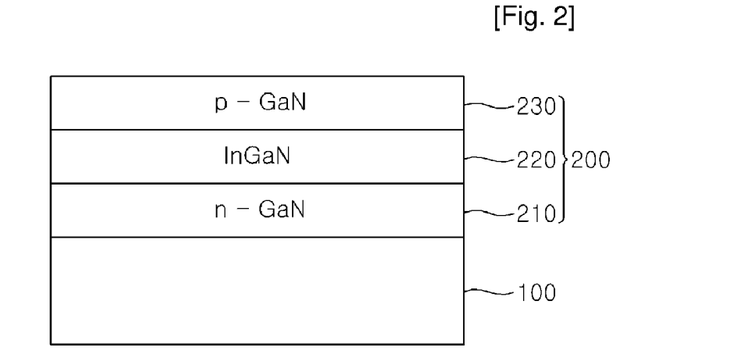
FIGS. 2 to 5 are sectional views showing a process of manufacturing the semiconductor light emitting element according to the first embodiment of the present invention.

The substrate 100 may be a SiC, Si, ZnO, GaAs or GaP substrate. Particularly, the sapphire substrate is more preferable to be used.

The light emitting layer 200 may include one of a Si film, a GaN film, an AN film, an InGaN film, an AlGaN film, an AlInGaN film and a film including them. In this embodiment, the n-type layer 210 is formed by depositing a GaN thin film and thereafter implanting n-type impurities, the active layer 220 with a multiple quantum well structure is formed on the n-type layer 210 by alternately depositing a GaN thin film which is barrier layer and an InGaN thin film which is a well layer, and the p-type layer 230 is formed by depositing a GaN thin film on the active layer 220 and then implanting p-type impurities. At this time, a buffer layer (not shown) may be additionally formed between the substrate 100 and the n-type layer 210. The buffer layer reduces the stress caused by lattice mismatch between the substrate 100 and the n-type layer 210 and helps the n-type layer 210 grow smoothly.

The light emitting layer 200, particularly the p-type layer 230, may be surface treated in order to form a high-quality thin film thereon and to enhance adhesive strength of an interface. A primary surface treatment may be performed by dipping the light emitting layer 200 into an aqua regia solution ($HCl:H_2O=3:1$) for 10 minutes, cleansing with deionized water, and then drying with nitrogen. Then, a secondary surface treatment may be performed by dipping the light emitting layer 200 into a solution in which HCl and deionized water are mixed at a ratio of 1 to 1 for 1 minute and then drying, before depositing a subsequent layer, i.e., a p-type electrode.

Figure 3:
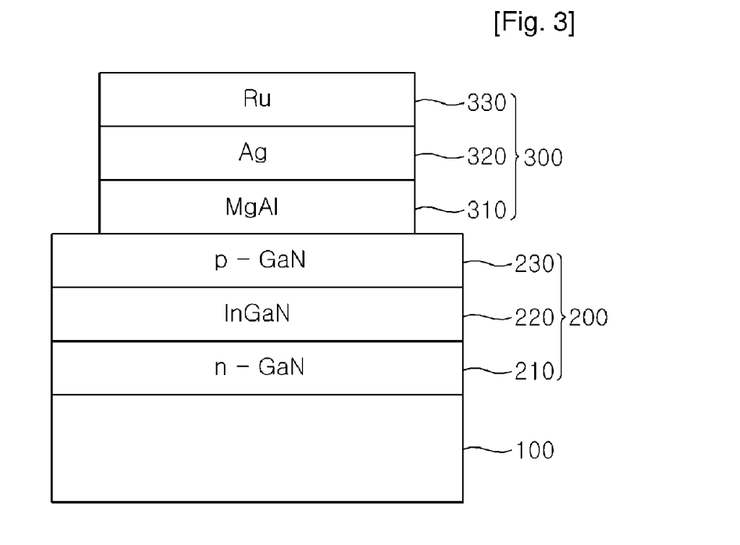

Referring to FIG. 3, a contact layer 310, a reflective layer 320 and a protective layer 330 are consecutively laminated on the light emitting layer 200. An alloy layer including Al metal and any one metal selected from Mg, Cu, In and Sn may be used as the contact layer 310. A metal layer including Ag metal may be used as the reflective layer 320. And a metal layer including any one metal selected from Ru, Ir, Rh, Pt, W, Ta, Ti and Co may be used as the protective layer 330. At this time, the contact layer 310 may be formed to have a thickness of 2 to 5 nm, the reflective layer 320 may be formed to have a thickness of 150 to 5000 nm, and the protective layer 330 may be formed to have a thickness of 40 to 100 nm. In this embodiment, the contact layer 310 is formed by depositing an MgAl film to have a thickness of 5 nm, the reflective layer 320 is formed by depositing an Ag film to have a thickness of 300 nm, and the protective layer 330 is formed by depositing a Ru film to have a thickness of 50 nm.

Figure 4:
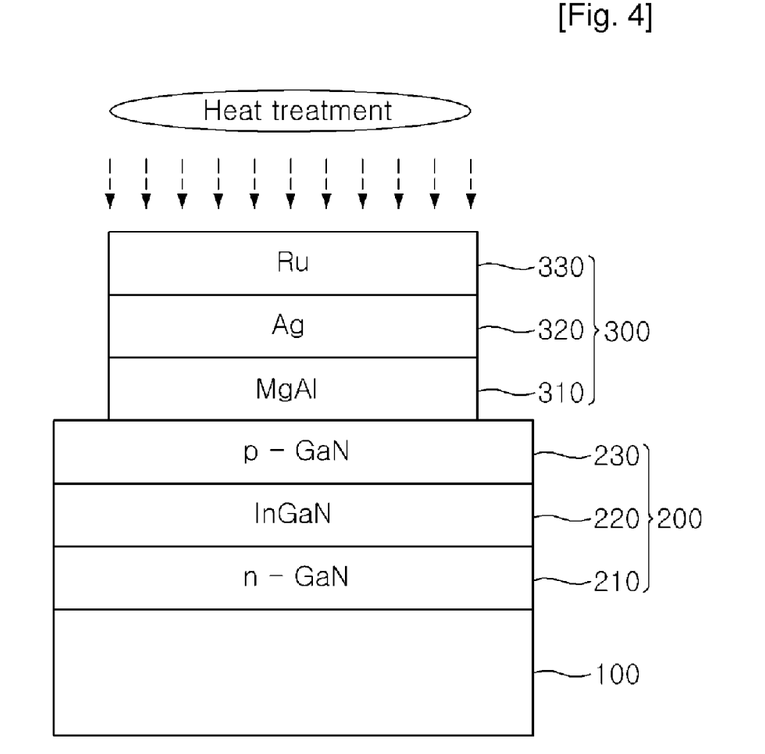

Referring to FIG. 4, the p-type electrode 300 is an ohmic electrode formed by performing a rapid thermal annealing process of a multi-layered electrode having an MgAl/Ag/Ru structure in air.

Such a heat treatment process may be performed under an atmosphere containing oxygen. That is, the heat treatment process may be performed under any one of an oxygen atmosphere, an air atmosphere, an oxygen-nitrogen mixture atmosphere, and an oxygen-argon mixture atmosphere. At this time, the pressure of the atmosphere containing oxygen may be atmospheric pressure or less, and the heat treatment process is performed at a temperature of 200 to 600° C. for about 1 minute.

If the multi-layered electrode with an MgAl/Ag/Ru structure is heat treated in air, diffusion of Ag particles is generated in the Ag reflective layer 320. At this time, since the Ag particles, which infiltrate into the MgAl contact layer 310 due to the in-diffusion of the Ag particles, are metallized on the entire interface between the MgAl contact layer 310 and the p-type layer 230, so that the ohmic electrode 300 has strong adhesive strength and low contact resistance. In addition, since the MgAl contact layer 310 blocks excessive in-diffusion of the Ag reflective layer 320 to prevent interface void of the Ag reflective layer 320 and the Ru protective layer 330 blocks out-diffusion of the Ag reflective layer 320 to prevent agglomeration of the Ag reflective layer 320, the ohmic electrode has high light reflectance and excellent thermal stability.

Figure 5:
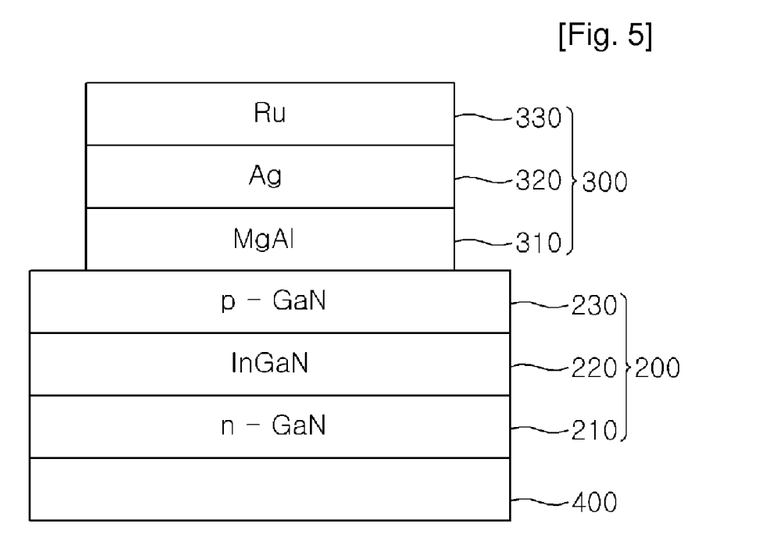

Referring to FIG. 5, a lift-off process for separating the substrate 100 adhering to the n-type layer 210 is performed by irradiating excimer laser onto a lower portion of the substrate 100, and an n-type electrode 400 is formed on the n-type layer 210 from which the substrate 100 is removed, and thereby a semiconductor light emitting element provided with the aforementioned structure is manufactured.

In order to understand the characteristics of the p-type electrode 300, i.e., ohmic electrode, which is employed to the semiconductor light emitting element according to this embodiment, experimental and comparative examples will be described as follows. As the experimental example, the ohmic electrode 300 with an MgAl/Ag/Ru structure formed by laminating MgAl, Ag and Ru thin films 310, 320 and 330 on a light emitting layer 200 and then performing a heat treatment process in air at a temperature of 450° C. for about 1 minute was used.

Figure 6:
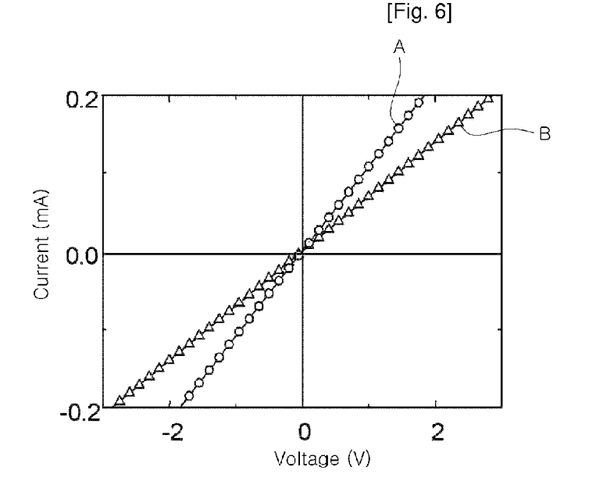
FIG. 6 is a graph showing current-voltage characteristics of an ohmic electrode according to an experimental example of the present invention and a comparative example.

FIG. 6 is a graph showing current-voltage characteristics of the ohmic electrode according to the experimental example of the present invention and the comparative example. Line A in the graph of FIG. 6 represents a current-voltage characteristic of the ohmic electrode with an MgAl/Ag/Ru structure according to the experimental example, and line B represents a current-voltage characteristic of the ohmic electrode with a Ni/Au structure according to the comparative example.

Referring to FIG. 6, when lines A and B in the graph are compared with each other, it can be seen that the current-voltage characteristic of the ohmic electrode according to the experimental example are superior. At this time, the contact resistance of the ohmic electrode with an MgAl/Ag/Ru structure according to the experimental example is calculated to be $2\times10^{-4}$ $\Omega cm^2$, which is a very small value.

Figure 7:
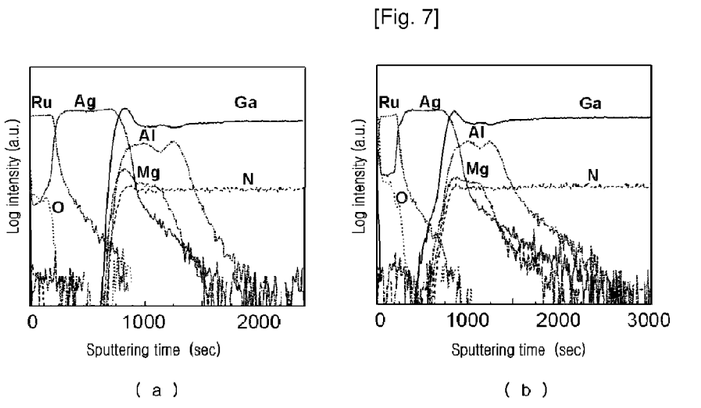
FIG. 7 is a graph showing analysis results of depth profile by a secondary ion-mass spectroscopy (SIMS) before and after heat treatment of the ohmic electrode according to the experimental example of the present invention.

FIG. 7 is a graph showing analysis results of depth profile by a secondary ion-mass spectroscopy (SIMS) before and after heat treatment of the ohmic electrode according to the experimental example of the present invention. Here, FIG. 7 (a) shows a state before the heat treatment, and FIG. 7 (b) shows a state after the heat treatment.

When FIGS. 7 (a) and (b) are compared with each other, it can be seen that out-diffusion of Ga after the heat treatment is significant. This means that a larger number of Ga vacancies may be generated on an interface between the GaN light emitting layer 200 and the ohmic electrode 300 after the heat treatment. Since the Ga vacancies formed in the GaN light emitting layer 200 function as acceptors for producing holes, interface adhesive strength is enhanced and contact resistance is lowered after the heat treatment.

Figure 8:
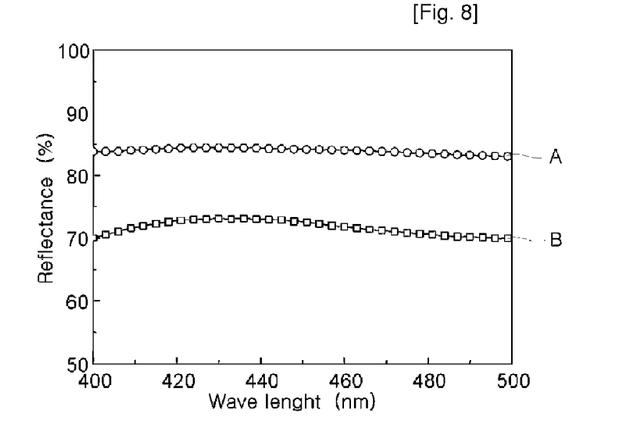
FIG. 8 is a graph showing light reflectance of the ohmic electrodes according to the experimental example of the present invention and the comparative example.

FIG. 8 is a graph showing light reflectance of the ohmic electrodes according to the experimental example of the present invention and the comparative example, wherein the light reflectance is measured at a wavelength band of 460 nm. Line A in the graph of FIG. 8 represents light reflectance of the ohmic electrode with an MgAl/Ag/Ru structure after the heat treatment according to the experimental example, and line B represents light reflectance of the ohmic electrode with an Ag/Ru structure after the heat treatment according to the comparative example.

Referring to FIG. 8, the ohmic electrode without Ru protective layer according to the comparative example shows a low light reflectance of 72%. On the other hand, the ohmic electrode with the Ru protective layer according to the experimental example shows a high light reflectance of 85%. This is because in the ohmic electrode with an MgAl/Ag/Ru structure according to the present invention, the MgAl contact layer and the Ru protective layer respectively prevent the agglomeration of the Ag reflective layer at the interface with the light emitting layer and a surface thereof, and thus a high light reflectance characteristic of Ag is maintained as it is.

Figure 9:
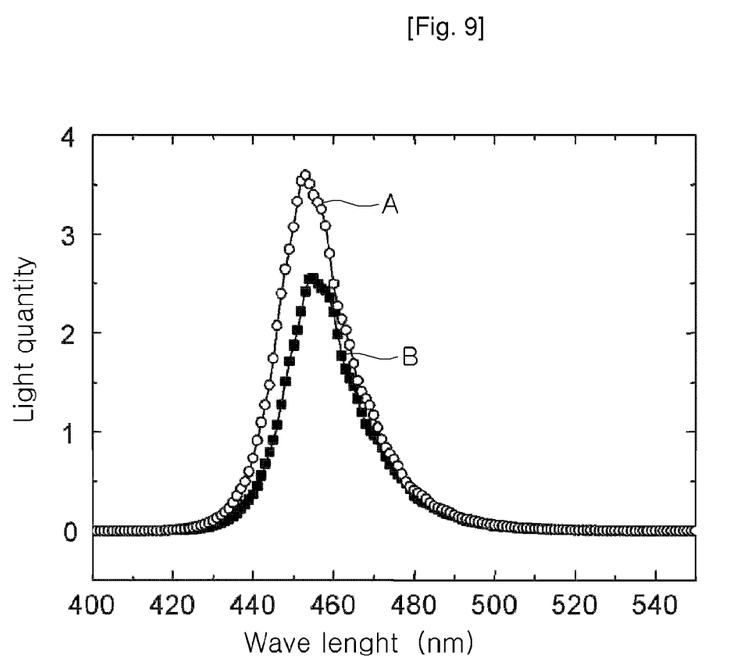
FIG. 9 is a graph showing the electrical light emitting spectrum of the semiconductor light emitting element according to the first embodiment of the present invention.

FIG. 9 is a graph showing the electrical light emitting spectrum of the semiconductor light emitting element according to the first embodiment of the present invention. Line A in the graph of FIG. 9 represents a case where the ohmic electrode with an MgAl/Ag/Ru structure according to the experimental example is used as a p-type electrode, and line B represents a case where the ohmic electrode with a Ni/Ag structure according to the comparative example is used as a p-type electrode.

When lines A and B of FIG. 9 are compared with each other, it can be seen that the output light intensity in a case where the ohmic electrode with an MgAl/Ag/Ru structure is used as a p-type electrode is remarkably increased as compared with a case where the ohmic electrode with a Ni/Ag structure is used as a p-type electrode. Similar result to the graphs according to the experiment can be obtained, even if an ohmic electrode is alternatively formed of other metals described above.

As such, the ohmic electrode 300 applied to the semiconductor light emitting element according to this embodiment has low contact resistance together with strong adhesive strength and excellent thermal stability together with high light reflectance. Accordingly, the omhic electrode can be appropriately used in a high power light emitting element through the application of large current, i.e., a semiconductor light emitting element with the aforementioned vertical structure or with a following flip-chip structure. In this case, an excellent light emitting characteristic can be expected.

Hereinafter, a semiconductor light emitting element with a flip-chip structure will be described. At this time, descriptions overlapping with the aforementioned embodiment will be omitted or briefly described.

Figure 10:
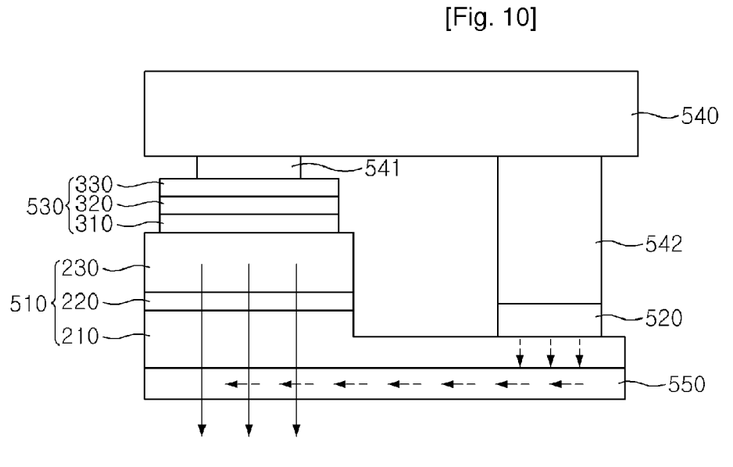
FIG. 10 is a sectional view showing a semiconductor light emitting element having a flip-chip structure according to a second embodiment of the present invention.

FIG. 10 is a sectional view showing a semiconductor light emitting element with a flip-chip structure according to a second embodiment of the present invention.

Referring to FIG. 10, the semiconductor light emitting element includes a light emitting layer 510 with a multi-layered structure having an n-type layer 210, an active layer 220 and a p-type layer 230, an n-type electrode 520 formed in a predetermined region of the n-type layer 210, a p-type electrode 530 formed on the p-type layer 130, and a submount substrate 540 connected to the two electrodes 520 and 530 using bumps 541 and 542. The semiconductor light emitting element further includes a diffusion layer 550 formed under the n-type layer 210.

The p-type electrode 530 includes a contact layer 310, a reflective layer 320 and a protective layer 330. That is, the aforementioned ohmic electrode with an MgAl/Ag/Ru structure may be used. Accordingly, the adhesive strength between the p-type layer 130 and the contact layer 310 can be enhanced, and the interface therebetween is planarized, thereby the light reflection efficiency of the Ag reflective layer 320 can be maximized. In addition, the Ag reflective layer 320 is protected since it is covered with the protective layer 330, so that it is possible to prevent the deterioration and agglomeration of the Ag reflective layer 330 due to heat generated in a subsequent heat treatment process or operation process.

Since the diffusion layer 550 allows the current applied to the n-type electrode 520 to be uniformly diffused into the n-type layer 510 and allows the heat transferred through the n-type layer 510 to be effectively radiated, the high power and reliability of the semiconductor light emitting element are ensured.

A process of manufacturing the semiconductor light emitting element having such a configuration according to the second embodiment of the present invention will be briefly described as follows.

An n-type layer 210, an active layer 220 and a p-type layer 230 are sequentially laminated on a mother substrate (not shown), and a patterning process is then performed using a predetermined mask, to thereby form individual cells. Then, an MgAl contact layer 310, an Ag reflective layer 320 and a Ru protective layer 330 are additionally laminated on the p-type layer 230, and a heat treatment process is performed in air at a temperature of 450° C. for about 1 minute, to thereby form an ohmic electrode, i.e., a p-type electrode 530, with low contact resistance and excellent light reflectance. Then, two electrodes 520 and 530 are mounted on a submount substrate 540 using bumps 541 and 542. Thereafter, the mother substrate is removed by performing a lift-off process using an excimer laser, and a diffusion layer 550 is attached to a bottom of the mother substrate. Since the diffusion layer 550 allows power applied to the n-type electrode 520 to be diffused and the light emitted from the active layer 220 is emitted through the diffusion layer 550, the diffusion layer 550 may be formed of a material with excellent conductivity and transmissivity, e.g., ITO (Indium Tin Oxide) or IZO (Indium Zinc Oxide).

A process of operating the semiconductor light emitting element with such a configuration according to the second embodiment of the present invention will be briefly described as follows.

If power is applied to the two electrodes 520 and 530, electrons and holes are provided to the active layer 220 from the n-type layer 210 and from the p-type layer 230, respectively. The holes and electrons provided to the active layer 220 emit excitation energy as light while being combined or recombined with each other, and the light is then emitted to the outside through the diffusion layer 550 that is a light exit surface. At this time, the light emitted to the upper direction from the active layer 220, i.e., to the p-type layer 230, is reflected by the p-type electrode 530 having the reflective layer 320 and then emitted to the outside through the light exit surface 550. Accordingly, utilization efficiency of light can be increased.

Although the present invention has been described in connection with the aforementioned embodiments and the accompanying drawings, the present invention is not limited thereto but defined by the appended claims. Accordingly, it will be understood by those skilled in the art that various modifications and changes can be made thereto without departing from the technical spirit of the appended claims.

The invention claimed is:

1. An ohmic electrode, comprising:
   a nitride-based semiconductor layer to emit light;
   a contact layer comprising an Al alloy and disposed on the nitride-based semiconductor layer functioning as a light emitting layer;
   a reflective layer comprising Ag and disposed on the contact layer; and
   a protective layer disposed on the reflective layer to restrain out-diffusion of the reflective layer, wherein,
   the contact layer is formed of an alloy comprising Al and any one metal selected from Mg, Cu, In, and Sn, and
   an interface of the nitride-based semiconductor layer and the contact layer comprises Ag diffused from the reflective layer.

2. The ohmic electrode as claimed in claim 1, wherein the contact layer is 2 to 5 nm in thickness, the reflective layer is 150 to 5000 nm in thickness, and the protective layer is 40 to 100 nm in thickness.

3. The ohmic electrode as claimed in claim 1, wherein the protective layer comprises any one metal selected from Ru, Ir, Rh, Pt, W, Ta, and Co.

4. The ohmic electrode as claimed in claim 1, wherein the reflective layer is disposed between and directly contacts the contact layer and the protective layer.

5. A method of forming an ohmic electrode disposed on a nitride-based semiconductor layer that emits light, the method comprising:
   sequentially laminating a contact layer comprising an Al alloy, a reflective layer comprising Ag, and a protective layer on the semiconductor layer, to produce a laminated resultant; and
   performing a heat treatment process on the laminated resultant, to diffuse Ag from the reflective layer into an interface between the contact layer and the semiconductor layer,
   wherein the Al alloy comprises Al and any one metal selected from Mg, Cu, In, and Sn.

6. The method as claimed in claim 5, wherein the protective layer comprises any one metal selected from Ru, Ir, Rh, Pt, W, Ta, and Co.

7. The method as claimed in claim 5, wherein the heat treatment process is performed at a temperature of 200 to 600° C.

8. The method as claimed in claim 5, wherein the heat treatment process is performed in an atmosphere containing oxygen.

9. The method as claimed in claim 5, wherein the atmosphere containing oxygen is any one of an oxygen atmosphere, an air atmosphere, an oxygen-nitrogen mixture atmosphere, and an oxygen-argon mixture atmosphere.

10. A semiconductor light emitting element, comprising:
    a nitride-based semiconductor layer to emit light; and
    an ohmic electrode disposed on the nitride-based semiconductor layer,
    wherein the ohmic electrode comprises:
      a contact layer comprising an Al alloy and disposed on the nitride-based semiconductor layer;
      a reflective layer comprising Ag disposed on the contact layer; and
      a protective layer disposed on the reflective layer, wherein,
    the Al alloy comprises Al and any one metal selected from Mg, Cu, In, and Sn, and
    an interface of the nitride-based semiconductor layer and the contact layer comprises Ag diffused from the reflective layer.

11. The semiconductor light emitting element as claimed in claim 10, wherein the semiconductor layer comprises an n-type layer, an active layer, and a p-type layer that are sequentially laminated.

12. The semiconductor light emitting element as claimed in claim 10, wherein the protective layer comprises any one metal selected from Ru, Ir, Rh, Pt, W, Ta, and Co.

13. The semiconductor light emitting element as claimed in claim 10, wherein the reflective layer is disposed between and directly contacts the contact layer and the protective layer.

* * * * *